United States Patent
Rosenman et al.

(10) Patent No.: US 6,597,492 B1
(45) Date of Patent: Jul. 22, 2003

(54) FABRICATION OF AN INVERTEDLY POLED DOMAIN STRUCTURE FROM A FERROELECTRIC CRYSTAL

(75) Inventors: Gil Rosenman, Rishon Le-Zion (IL); Alexander Skliar, Lod (IL); Moshe Oron, Rehovot (IL); David Eger, Rehovot (IL); Mordechai Katz, Ramat Gan (IL)

(73) Assignees: The State of Israel Atomic Energy Commission Soreq Nuclear Research Center, Yavne (IL); Ramot University Authority for Applied Research & Industrial Development Ltd., Ramat Aviv (IL)

( * ) Notice: Subject to any disclaimer, the term of this patent is extended or adjusted under 35 U.S.C. 154(b) by 0 days.

(21) Appl. No.: 09/367,308
(22) PCT Filed: Feb. 4, 1998
(86) PCT No.: PCT/IL98/00054
§ 371 (c)(1), (2), (4) Date: Apr. 28, 2000
(87) PCT Pub. No.: WO98/36109
PCT Pub. Date: Aug. 20, 1998

(30) Foreign Application Priority Data

Feb. 12, 1997 (IL) .................................. 120203

(51) Int. Cl.[7] .............................. G02F 1/35; C30B 30/02
(52) U.S. Cl. ............................... 359/326; 117/2; 117/3; 117/923; 117/948
(58) Field of Search ................................ 359/326–332; 385/122; 117/2, 3, 204, 923, 948

(56) References Cited

U.S. PATENT DOCUMENTS

| | | | |
|---|---|---|---|
| 5,082,349 A | 1/1992 | Cordova-Plaza et al. | 385/2 |
| 5,171,400 A | 12/1992 | Magel et al. | 156/603 |
| 5,193,023 A | 3/1993 | Yamada et al. | |
| 5,277,905 A | 1/1994 | Foncerrada et al. | 424/93 L |
| RE34,967 E | 6/1995 | Clark et al. | 359/100 |
| 5,436,758 A * | 7/1995 | Agostinelli et al. | 359/332 |
| 5,477,807 A | 12/1995 | Yamada et al. | 117/2 |
| 5,526,173 A | 6/1996 | Yamaguchi et al. | 359/328 |
| 5,756,263 A * | 5/1998 | Gupta et al. | 359/328 X |
| 5,875,053 A * | 2/1999 | Webjorn et al. | 359/326 |
| 5,986,798 A * | 11/1999 | Karlsson et al. | 359/326 |
| 6,295,159 B1 * | 9/2001 | Lung-Han et al. | 359/326 |

FOREIGN PATENT DOCUMENTS

EP 0687941 12/1995

OTHER PUBLICATIONS

Matsumoto et al., "Quasiphase–Matched Second Harmonic Generation of Blue Light in Electrically Periodically–Poled Lithium Tantalate Waveguides", Electronics Letters, vol. 27, No. 22, 24 Oct. 24, 1991, pp. 2040–2042.*

Yamada et al, "First–Order Quasi–Phase Matched LiNbO3 Waveguide Periodically Poled By Applying an External Field for Efficient Blue Second–Harmonic Generation", Applied Physics Letters, vol. 62, No. 5, Feb. 1, 1993, pp. 435–436.*

(List continued on next page.)

Primary Examiner—John D. Lee
(74) Attorney, Agent, or Firm—Browdy and Neimark

(57) ABSTRACT

A method of fabricating an invertedly poled domain structure having alternating sections of opposite electric polarities, from a ferroelectric crystal wafer (1) having two opposite polar surfaces, comprises patterning at least one of the two polar surfaces of the wafer to comprise a plurality of alternating discrete regions, of which first regions are adapted for and second regions are protected from the direct application thereto of an electric contact; applying to both polar surfaces of the wafer electrically conducting electrodes (10 and 11) so that the first regions are in direct contact with the electrodes and the second regions are protected from such a contact; and applying to the electrodes an electrical field (20) of the intensity E. The electrical field is applied to the wafer at a working temperature by heater/cooler (15).

47 Claims, 5 Drawing Sheets

OTHER PUBLICATIONS

Baron et al., "Domain Inversion in LiTaO$_3$ and LiNbO$_3$ by Electric Field Application on Chemically Patterned Crystals", *Applied Physics Letters*, vol. 68, No.4, pp.481–483, (Jan. 1996).

Morris et al., "Reduction of ionic conductivity of flux grown KTiOPO$_4$ crystals", *Journal of Crystal Growth* vol. 109, pp. 367–375, (1991).

Myers et al., "Quasi–phase–matched optical parametric oscillators in bulk periodically poled LiNbO$_3$", *J. Opt. Soc. Am.*$^B$, vol. 12, No. 11, pp. 2102–2116, (Nov. 1995).

Zhu et al., "LiTaO$_3$ crystal periodically poled by applying an external pulsed field", *J. Appl. Phys.*, vol. 77 No. 10, pp. 5481–5483, (May 1995).

Houé et al., "An introduction to methods of periodic poling for seconds–harmonic generation", *J. Phys. D: Appl. Phys.*, vol. 28, pp. 1747–1763, (1995).

Risk et al., "Periodic electric field poling of KTiOPO$_4$ using chemical patterning", *Appl. Phys. Lett.*, vol. 69 No. 26, pp. 3999–4001, (Dec. 1996).

Patent Abstracts of Japan, Publication No. 07027936, Publication Date Jan. 31, 1995.

Patent Abstracts of Japan, Publication No. 06308340, Publication Date Nov. 4, 1994.

* cited by examiner

US 6,597,492 B1

FABRICATION OF AN INVERTEDLY POLED DOMAIN STRUCTURE FROM A FERROELECTRIC CRYSTAL

CROSS REFERENCE TO RELATED APPLICATION

The present application is the national stage under 35 U.S.C. 371 of PCT/IL98/00054, filed Feb. 4, 1998.

FIELD OF THE INVENTION

The present invention refers to a method of fabricating controlled domain structures in ferroelectric materials where domains of different sections of the structure have different polarities. Ferroelectric structures of this kind are used in applications where it is required to change properties of electromagnetic radiation, for example, in non-linear optical converters where a fundamental radiation having one frequency is converted into a radiation having another frequency.

BRIEF DESCRIPTION OF THE DRAWINGS

For a better understanding of the present invention and to show how the same may be carried out in practice, reference will now be made by way of example only, to the accompanying drawings, in which.

BACKGROUND OF THE INVENTION

Optical converters of the kind specified are used as sources of coherent radiation for such applications where, for example, laser sources of a required radiation frequency are unavailable or where the turnability of a source of radiation is required in a relatively wide range of frequencies. To achieve efficient optical frequency conversion, phase propagation velocities of fundamental and converted radiation must be equalized, i.e. phase matching should be provided.

The optical conversion of the kind specified is based on nonlinear electronic polarization which may be observed in crystals having no center of symmetry. Some crystals of this kind, namely ferroelectric crystals, are characterized by having an electrical spontaneous polarization $P_s$. The sign of their nonlinear optical coefficient and their electro-optic coefficient depends on the direction of the vector of this spontaneous polarization. The direction of the spontaneous polarization can be reversed by applying to the crystal an external electric field stronger than the crystal's threshold defined as a coercive field. This possibility to selectively switch the spontaneous polarization $P_s$ in the crystals makes the ferroelectric materials specifically suitable for the fabrication of structures having alternating sections in which domains have opposite electric polarities. In the alternating sections of such structures, the nonlinear optical coefficient has opposite signs, by means of which a desired phase matching is obtained.

One of known phase-matching methods is quasi-phase matching which is associated with such ferroelectric structures where the sections of invertedly poled domains are arranged periodically. These structures are known as periodically poled domain structures (PPDS) and FIG. 1 herein illustrates an example of such a structure.

The fabrication of ferroelectric structures of the kind specified may be performed by different ways of which one is based on the application to a ferroelectric crystal wafer of an external electric field which is stronger than the coercive field of the crystal, which causes the inversion of a polar axis thereof. This method generally comprises the following sequence of operations:

(a) patterning at least one of two polar surfaces of the wafer to comprise a plurality of alternating discrete first and second regions, of which said first regions are adapted for and said second regions are protected from the direct application thereto of an electric contact;

(b) applying to both polar surfaces of the wafer electrically conducting electrodes so that the first regions of said at least one polar surface are in direct contact with the electrodes and the second regions of said surface are protected from such a contact; and (c) applying to the electrodes an electric voltage to provide an electrical field E equal to or stronger than the material's coercive field $E_c$ and weaker than the breakdown field $E_{br}$ of the material.

Figure 2:
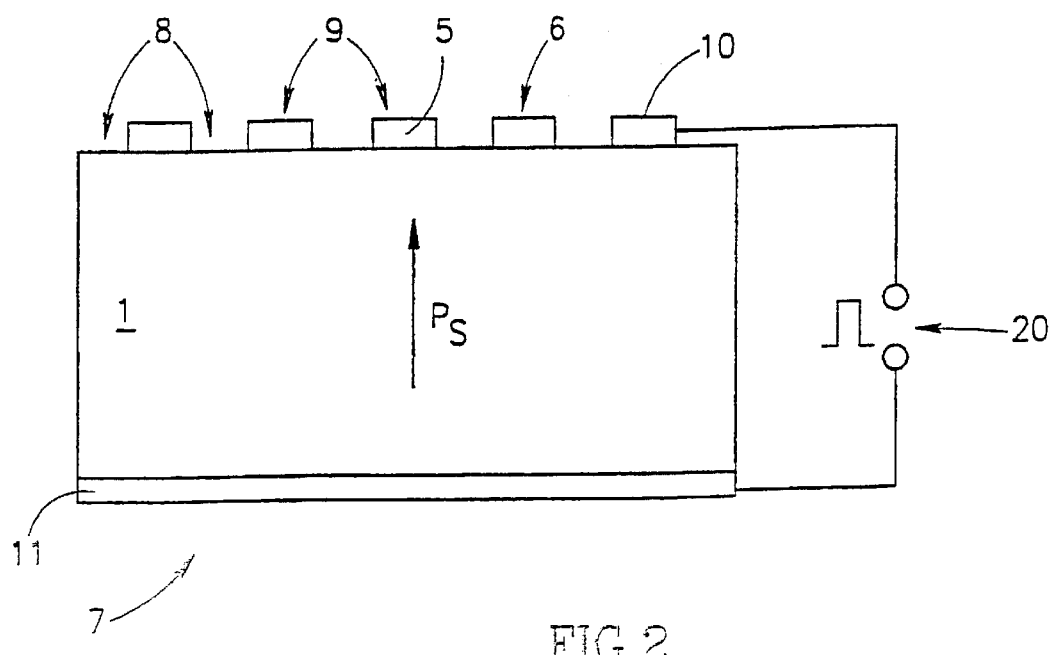
FIG. 2 is a schematic illustration of a wafer in which one polar surface is formed with a patterned layer of an isolating material.

Step (a) of the above method may be performed in different ways. Thus, there may be formed on said at least one polar surface of the wafer, a patterned layer of an isolating material, for example, such as shown in FIG. 2 herein or as disclosed in U.S. Pat. No. 5,526,173; or selected regions of the wafer adjacent to the polar surface may be chemically modified so as to inhibit subsequent nucleation and growth of selected domains, such as disclosed in EP 689 941 and illustrated in FIG. 3 herein.

The electrodes applied to the polar surfaces of the wafer in step (b) of the above method, in particular the electrode applied to the patterned polar surface of the wafer, may be either in the form of a continuous layer or in the form of an array of separate electrodes each directly connected with a corresponding first region.

The electric field E applied to the wafer in step (c) above will be referred to herein as a "switching field" and the voltage by means of which such a field is provided will be referred to as "switching voltage". The purpose of step (c) is to cause the switching of the crystal polarity in those sections of the wafer which are associated with said first regions, whilst in the sections associated with the second regions, the original polarity will be kept unchanged. For most applications, it is desired that the switching is performed in such a manner that interfaces between the sections having opposite polarities are parallel to each other and extend through the entire crystal body from one of its polar surfaces to the other.

Most of processes of fabrication of invertedly poled structures are presently performed and the set up used therein is adapted for operation at room temperature. However, most of attempts to use these processes for the fabrication of periodic ferroelectric structures, especially with fine pitches between the sections, from commercially available ferroelectric crystals, encountered serious uniformity problems which constitute the main obstacle for the commercial application of such structures especially for bulk optical devices enabling operations with high power optical fluxes.

The materials usually used for the production of structures of invertedly poled domains are highly isolating ferroelectric crystals such as $LiTaO_3$, $LiNbO_3$, $KTiOPO_4$ (KTP) and $RbTiOAsO_4$.

$LiNbO_3$ and $LiTaO_3$ are the most popular. However, these materials are known to have, at room temperature, very high coercive fields and, therefore, require the application of extremely high switching fields, i.e. about 260 kV/cm. Such high fields lead to lateral displacement of domain walls which renders the fabrication of uniform structures having small periods very difficult, if not impossible. Moreover, since the intensity of the electrical field depends on the applied switching voltage and on the wafer's thickness, the high switching electric fields may be obtained either by the increase of the applied switching voltage or by the use of thin wafers. However, a max value of the applicable switching voltage is limited by practical considerations which put extremely severe limitations on the maximal thickness of wafers. Thus, the maximal thickness which a crystal of $LiNbO_3$ or $LiTaO_3$, may have to obtain the complete polarity inversion at room temperature is about 0.5 mm, whilst with greater thickness, the polarity inversion cannot be achieved.

In KTP crystals and in some of its isomorphs, the coercive fields at room temperature are relatively low (about 25 kV/cm) and, therefore, for the polarity inversion, they do not require the application of high electrical fields. These crystals also have a higher optical damage threshold than that of $LiNbO_3$ and are, therefore, more suitable for optical conversion. However, in view of the fact that the electrical conductivity of most of the commercially available KTP crystals is too high ($\sigma \approx 10^{-7} + 10^{-8}$ $\Omega^{-1}$ $cm^{-1}$) for the electrical poling process, it is very difficult to obtain the desired domain poling in the first unprotected regions while ensuring the efficient protection in the second regions. Therefore, most attempts to use the relatively highly conductive ferroelectric crystals such as flux grown KTP crystals, for the fabrication of invertedly poled domain structures, resulted in extremely nonuniform structures.

Thus, it is the object of the present invention to provide a method of fabrication of an invertedly poled domain structure of a ferroelectric crystal wafer, where the disadvantages discussed above are overcome. In particular, it is the object of the present invention to provide a controllable method of fabrication of an invertedly poled domain structure having high quality, high uniformity and high resolution.

SUMMARY OF THE INVENTION

In the present specification and claims, the term "dielectric response time $\tau_{res}$" is defined as $\tau_{res}=\kappa\epsilon/\sigma$ where $\kappa$ is the dielectric constant, $\epsilon$ is the vacuum permittivity and $\sigma$ is the electrical conductivity of a ferroelectric crystal. The term "switching time $\tau_{sw}$" means the time during which the complete domain polarity inversion occurs in the ferroelectric crystal at a predetermined intensity of an applied electric field. Both the dielectric response time and the switching time depend on the temperature at which the electric field is applied to the crystal and there exists a temperature $T_x$ at which the dielectric response time $\tau_{res}$ equals the switching time $\tau_{sw}$, above which $\tau_{res}<\tau_{sw}$ and below which $\tau_{res}>\tau_{sw}$.

According to a first aspect of the present invention there is provided a method of fabricating an invertedly poled domain structure having alternating sections of opposite electric polarities, from a ferroelectric crystal wafer having two opposite polar surfaces, the method comprising:

(a) patterning at least one of said two polar surfaces of the wafer to comprise a plurality of alternating discrete regions, of which first regions are adapted for and second regions are protected from the direct application thereto of an electric contact;

(b) applying to both polar surfaces of the wafer electrically conducting electrodes so that the first regions are in direct contact with the electrodes and the second regions are protected from such a contact;

(c) applying to the electrodes an electrical field of the intensity E which satisfies the condition $E_{br}>E\geq E_c$, $E_c$ being the coercive field of the ferroelectric crystal and $E_{br}$ being the breakdown field of the ferroelectric crystal; characterised in that said electrical field is applied to the wafer at a working temperature $T_w$ which satisfies the condition $T_{min}<T_w<T_x$, where the temperature $T_{min}$ is the minimal temperature at which the intensity E of the switching electric field still satisfies the condition $E_{br}>E\geq E_c$.

Thus, by performing the step (c) above at the temperature $T_w$ which is lower than $T_x$, it is ensured that the response time $\tau_{res}$ of the ferroelectric crystal wafer is longer than its switching time $\tau_{sw}$. Thus, the method of the present invention is based on the control of temperature at which the switching field is applied to the wafer, which allows to fabricate high quality invertedly poled domain structures from various ferroelectric crystals.

According to another aspect of the present invention, there is provided a method of fabricating an invertedly poled domain structure having alternating sections of opposite electric polarities, from a ferroelectric crystal wafer having two opposite polar surfaces, the method comprising:

(a) patterning at least one of said two polar surfaces of the wafer to comprise a plurality of alternating discrete regions, of which first regions are adapted for and second regions are protected from the direct application thereto of an electric contact;

(b) applying to both polar surfaces of the wafer electrically conducting electrodes so that the first regions are in direct contact with the electrodes and the second regions are protected from such a contact;

(c) applying to the electrodes an electrical field of the intensity E which satisfies the condition $E_{br}>E\geq E_c$, $E_c$ being the coercive field of the ferroelectric crystal and $E_{br}$ being the breakdown field of the ferroelectric crystal;

characterised in that the temperature at which the electrical field is applied to the wafer is below room temperature.

In the context of the present invention, the term "switching time $\tau_{sw}$" means the time during which the complete domain polarity inversion occurs in the sections of the wafer associated with the first, unprotected regions of the polar surface thereof. The switching time in fact defines the time which is required for the charge injected into the wafer by an external electrical current to reach the value of 2 Ps·S$_1$, where Ps is the electric spontaneous polarization of the ferroelectric material and S$_1$ is a total surface area of the first regions. On the other hand, the dielectric response time $\tau_{res}$ defines the time during which the charge drifted inside the crystal body between the polar surfaces of the wafer at the second, protected regions reaches the value of 2 Ps·S$_2$, where S$_2$ is a total surface area of the second regions.

For the complete domain polarity inversion in the wafer sections associated with the first regions of the wafer, a time interval $\tau_{dur}$ during which the switching field is applied to the ferroelectric crystal wafer, must not be shorter than the switching time $\tau_{sw}$. On the other hand, to avoid the switching in those sections of the wafer associated with the second, protected regions, the time interval $\tau_{dur}$ should be substantially shorter than the dielectric response time $\tau_{res}$ of the protected regions. Therefore, the time $\tau_{dur}$ should be chosen, in accordance with the present invention, so as to satisfy the above condition $\tau_{sw} < \tau_{dur} < \tau_{res}$.

By one mode of the present invention, said working temperature T$_w$ at which the electric field is applied to the electrodes is lower than room temperature. This mode is based on the realization that, in some ferroelectric materials, in particular those having relatively high electrical conductivity, the temperature T$_x$ below which a dielectric response time $\tau_{res}$ of the crystal is longer than a switching time $\tau_{sw}$ of the crystal at the chosen intensity E of the electric field, is lower than room temperature, whilst at room temperature, their dielectric response time $\tau_{res}$ is shorter than the switching time $\tau_{sw}$. Thus, for example, at the applied electric field in the range from 25 kV/cm to 65 kV/cm, the dielectric response time $\tau_{res}$ of KTP crystals at room temperature is about 30–300 $\mu$s whilst the switching time $\tau_{sw}$ is in the range of 1.66–0.075 ms. Consequently, at room temperature, it is practically impossible, with most commercially available KTP crystals, to choose the time interval $\tau_{dur}$ of the application of the electric field for which the condition stipulated in accordance with the present invention is satisfied, which does not allow for a controllable method of their fabrication providing high quality ferroelectric structures produced thereby.

By another mode of the present invention, the working temperature T$_w$ is higher than room temperature and substantially lower than Curie temperature of the ferroelectric crystal. The second mode of the present invention is based on the fact that in ferroelectric materials having at room temperature relatively low electrical conductivity, the temperature T$_x$ is higher than room temperature and the condition $\tau_{sw} < \tau_{dur} < \tau_{res}$ may be satisfied even at temperatures which are much higher than room temperature. By virtue of the increase of the crystal temperature, the coercive field thereof becomes weaker, whereby the switching electric field applied to the crystal may be much lower than that required at room temperature. This allows for the production of the structures with finer pitches between the sections having different polarities and at lower switching electric fields, and enables the use of thicker crystal wafers.

In accordance with still another mode of the present invention, which is specifically dedicated to ferroelectric crystals, a dielectric response time $\tau_{res}$ of which at room temperature is shorter than a switching time $\tau_{sw}$, the method comprises a starting step of modifying the crystal to change its conductivity and thereby to increase the dielectric response time $\tau_{res}$ so as to meet the condition $\tau_{res} > \tau_{sw}$.

Preferably, the time interval $\tau_{dur}$ meets the condition:

$$(1/3)\tau_{sw} \leq \tau_{dur} \leq (0.1/0.3)\tau_{res}$$

The switching field applied to the wafer in all modes of the method of the present invention may be in the form of a sequence of pulses the total duration of which is defined by $\tau_{dur}$.

For the patterning of said at least one polar surface of the wafer different methods may be used such as forming, on one of the polar surfaces, a patterned layer of an isolating material, or forming, adjacent to one of the polar surfaces, either a structure of chemically modified regions or a structure of shallow inverted domains.

Preferably, the operation (c) of the method of the present invention is performed with the wafer being mounted on a temperature controlled stage in a vacuum chamber.

Preferably, the ferroelectric material used in the method of the present invention is either K$_{1-x}$Rb$_x$TiOP$_{1-y}$As$_y$O$_4$ (1≧x≦0, 1≧y≧0); or A$_{1-x}$B$_x$Ti$_{1-z}$Nb$_z$OP$_{1-y}$As$_y$O$_4$ (1≧x0, 1≧y≧0, 1≧z≧0), where A and B are one of the alkaline elements; Na, K, Cs, Rb or H; or LiNb$_{1-x}$Ta$_x$O$_3$ (1≧x≧0); or KNb$_{1-x}$Ta$_x$O$_3$ (1≧x≧0).

The invertedly poled domain structures fabricated by the method of the present invention may be periodic and non-periodic and may be used for different purposes associated with conversion of electro-magnetic radiation. Periodically, poled domain structures fabricated by the method of the present invention are particularly useful to provide quasi-phase matching for their use, for example, in second harmonic generators, sum frequency generators, difference frequency generators, optical parametric oscillators and the like.

DETAILED DESCRIPTION OF THE PREFERRED MODES OF THE METHOD OF THE INVENTION

Figure 1:
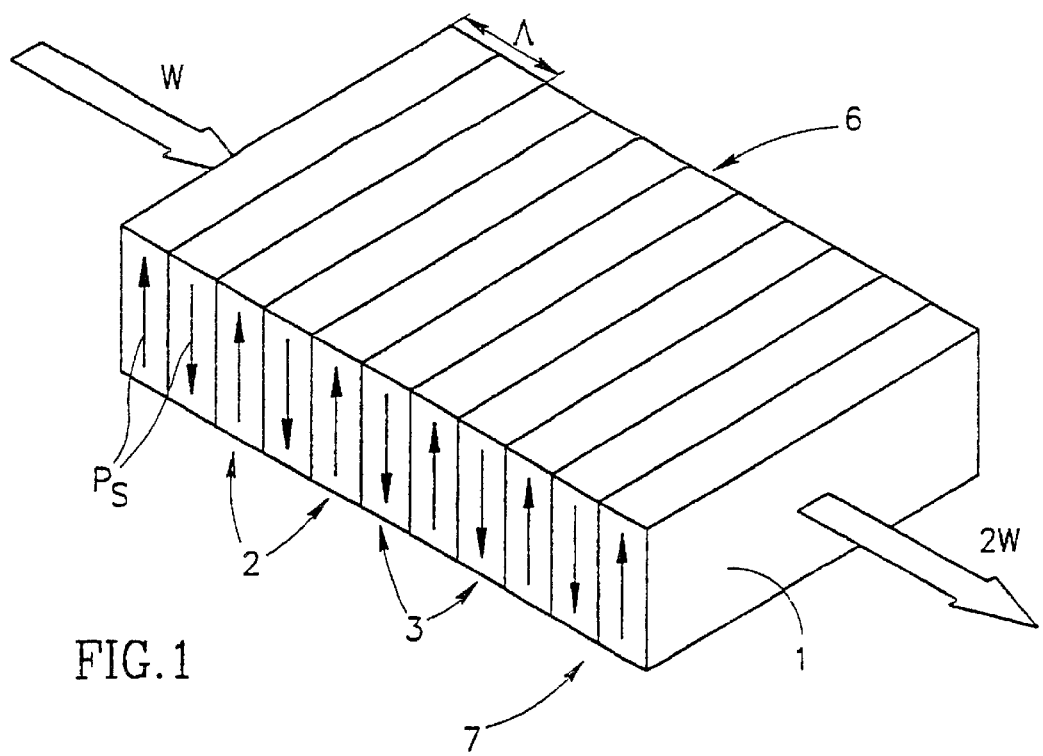
FIG. 1 is a schematic illustration of an invertedly poled domain structure fabricated by a method of the kind to which the present invention refers.

FIG. 1 is a schematic illustration of an invertedly poled domain structure 1 produced by a method of the kind to which the present invention refers. As seen, the structure 1 is periodic and has a regular domain configuration in which a vector of spontaneous polarization P$_s$ has opposite directions in adjacent sections 2 and 3 of the structure. The structure has a period of modulation Λ and is adapted to convert a radiation having a fundamental frequency ω into a radiation having a second harmonic frequency 2ω.

To fabricate the structure as shown in FIG. 1 from a ferroelectric crystal wafer having two polar surfaces 6 and 7, at least one polar surface of the wafer, namely the polar surface 6, is first patterned to have alternating first and second regions 8 and 9 such that the first regions 8 are adapted for and the second regions 9 are protected from the direct application thereto of an electric contact.

The patterning of the polar surface 6 may be performed by one of the following ways described with reference to FIGS. 2, 3 and 4.

FIG. 2 illustrates the polar surface 6 of the wafer, coated with a thin isolating layer (0.5–1.0 $\mu$m) of a photoresist material 5 patterned by means of any known microlithographic techniques. Thus, the photoresist 5 covers only the regions 9 of the wafer, thereby protecting these regions from the direct application thereto of an electric field. Alternatively, the photo-resist may be replaced by such isolators as, for example, SiO$_2$ or Si$_3$N$_4$.

Figure 3:
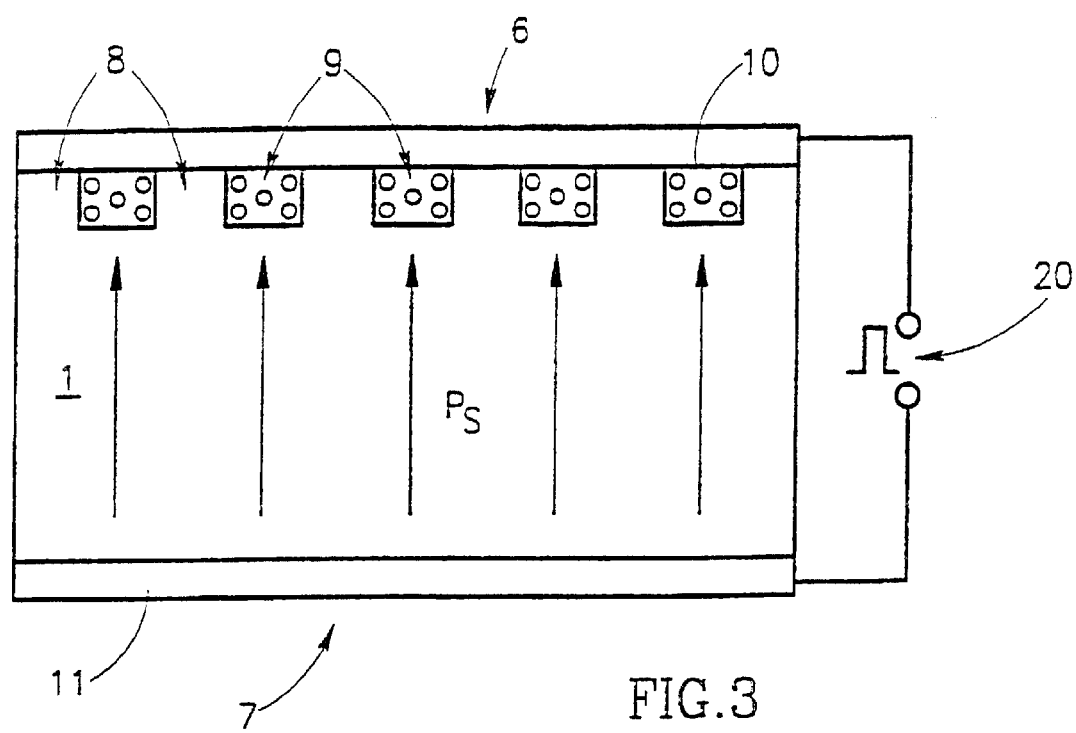
FIG. 3 is a schematic illustration of a wafer in which, adjacent one polar surface of the wafer, a structure of chemically modified regions is created.

FIG. 3 illustrates the wafer modified chemically in the regions 9 so as to inhibit domain nucleation and growth. This method is disclosed in EP 687 941 incorporated herein by reference.

Figure 4:
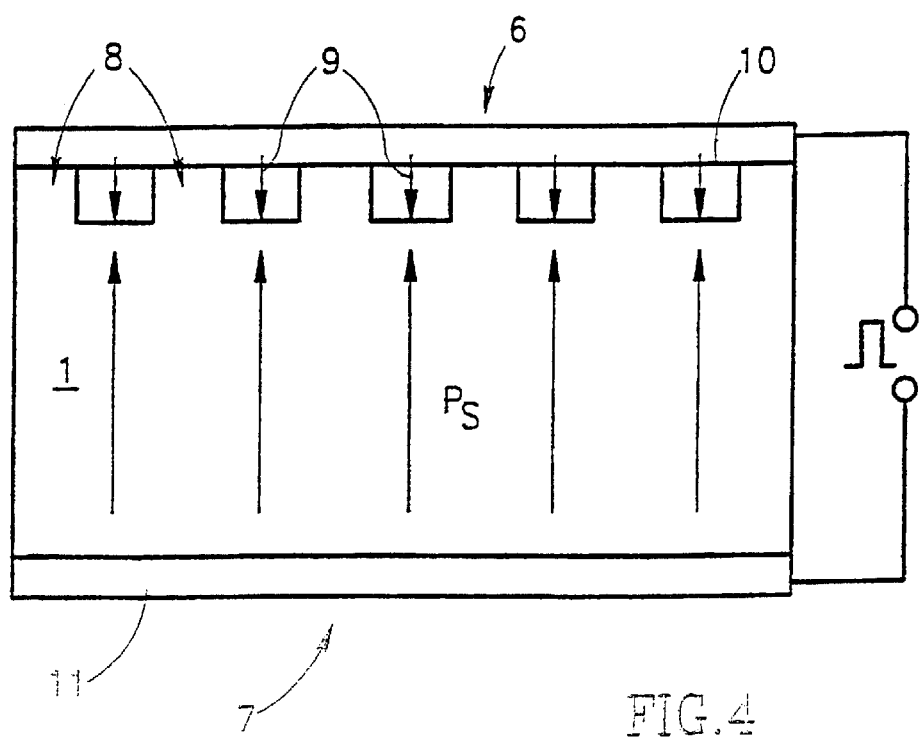
FIG. 4 is a schematic illustration of a wafer in which, adjacent one polar surface of the wafer, a structure of shallow inverted domains is created.

FIG. 4 illustrates the wafer having a shallow pattern of inverted domains in the regions 9. This method is generally based on the fabrication, in a ferroelectric material, of a bi-domain structure consisting of two adjacent domains of opposite polarity oriented in the 'head-to-head' or 'tail-to-tail' manner along the polar axis of the material, whereby there is in fact provided a highly stable invertedly poled domain layer disposed at regions 9 of the wafer perpendicular to the polar axis thereof and preventing the regions 9 from being influenced by an applied electric field. If, for example, the wafer is a KTP crystal, the invertedly poled domain layer is preferably formed by means of Rb-indiffusion on the C⁻ polar surface 6 of the wafer. The process of the formation of such a layer is described in D. Eger, M. Oron and M. Katz, J. Appl. Phys., 74, pp.4298–4302, 1993, incorporated herein by reference. Alternatively, the bi-domain structure may be fabricated by selective application of short electric pulses at the regions 9 of the wafer, or by exposing the polar surface 6 to an electron beam or other charged particles beam, or by different kinds of diffusion treatment.

As seen in FIGS. 2, 3 and 4, the patterned polar surface 6 and the opposite polar surface 7 of the wafer are further coated with continuous metallic layers which constitute switching electrodes 10 and 11, whereby the first regions 8 contact directly with the electrode 10 and the second regions 9 are protected from direct contact therewith. Alternatively, the continuous electrode 10 disposed on the patterned polar surface 6 of the wafer may be in the form of an array of separate electrodes each directly connected with a corresponding first region 2 (not shown).

Figure 5:
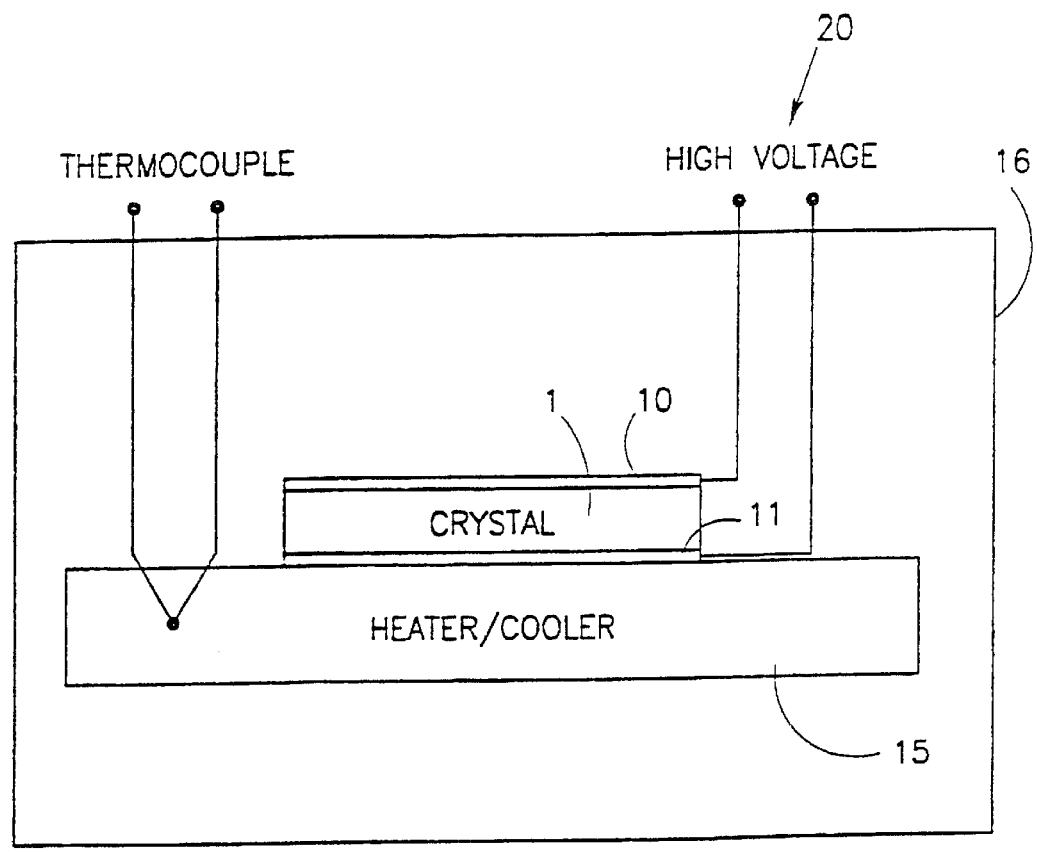
FIG. 5 is a schematic illustration of a vacuum chamber in which the method according to the preferred embodiment of the present invention is performed.

As schematically shown in FIG. 5, the wafer prepared as described above is mounted on a temperature controlled stage 15, preferably, in a vacuum chamber 16. The electrodes 10 and 11 are connected to an electric power source schematically designated as 20.

Subsequently, the temperature of the wafer is brought to a working temperature $T_w$ and a pulse of a switching voltage is applied to the electrodes 10 and 11 such as to provide the switching field of a predetermined intensity E, the pulse duration being $\tau_{dur}$ satisfying the condition $\tau_{sw}<\tau_{dur}<\tau_{res}$. Thereby, it is ensured that domains are completely inverted in the sections 2 of the wafer associated with the regions 8 of the polar surface 6 which are in direct contact with the electrode 10, and are not inverted in the section 3 of the wafer associated with the regions 9 which are protected as explained with reference to FIGS. 2, 3 and 4.

It should be mentioned that there exists an alternative solution to satisfy the above condition, which is modifying the crystal so as to change its conductivity to increase the dielectric response time $\tau_{res}$ to meet the condition $\tau_{res}>\tau_{sw}$. This may be done, for example, by means of a method described in P. A. Morris et al., Reduction of ionic conductivity of flux grown $KTiPO_4$, Journal of Crystal Growth, 109 (1991), 367–375, which is incorporated herein by reference.

There will now be described how to choose, in accordance with the present invention, the working temperature $T_w$ and the time interval $\tau_{dur}$ during which the switching electrical field should be applied to the wafer.

There is established a range of working temperatures $T_w$ satisfying the condition that $T_{min}<T_w<T_x$, where the temperature $T_{min}$ is the minimal temperature at which the intensity E of the switching electric field still satisfies the condition $E_{br}>E \geq E_c$, where $E_c=E_c(T)$ is the coercive field of the ferroelectric crystal and $E_{br}=E_{br}(T)$ is the breakdown field of the ferroelectric crystal, and where $T_x$ is the temperature below which the dielectric response time $\tau_{res}=\tau_{res}(T)$ of the crystal is longer than the switching time $\tau_{sw}=\tau_{sw}(T)$ of the crystal at the chosen intensity E of the switching electric field. The above mentioned parameters can be determined on the basis of physical measurements of the ferroelectric crystal which may be conducted on a reference piece wafer.

In ferroelectric crystals having, at room temperature, a relatively high electrical conductivity, the working temperature $T_w$ will most often be lower than room temperature and in ferroelectric crystals having, at room temperature, a relatively low electrical conductivity, it is preferable that the working temperature $T_w$ be higher than room temperature.

Figure 6:
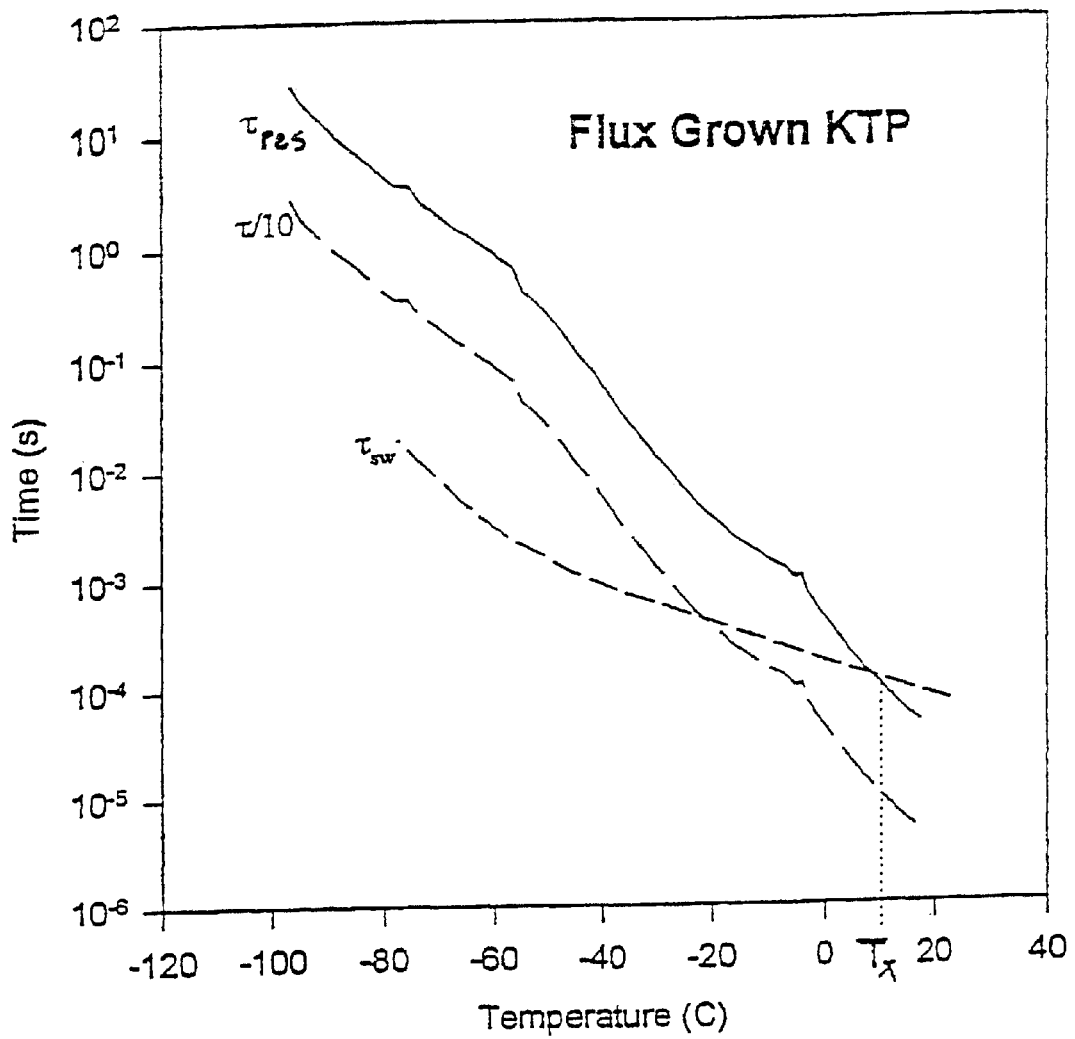
FIG. 6 illustrates the dependence on the temperature, of the dielectric response time and the switching time of a flux grown KTP, at the electric field of 65 kV/cm.

It will now be explained, as an example, with reference to FIG. 6, how $T_w$ and $\tau_{dur}$ are chosen for a flux grown KTP crystal. As seen in FIG. 6, the dielectric response time $\tau_{res}$ and the switching time $\tau_{sw}$ depend on the temperature at which the switching electric field is applied to the wafer. As seen, with the intensity of the switching electric field being 65 kV/cm, the dielectric response time $\tau_{res}$ of the crystal is shorter than its switching time $\tau_{sw}$ at a temperature higher than about $T_x$, whilst at a temperature lower than $T_x$, the dielectric response time $\tau_{res}$ is longer than the switching time $\tau_{sw}$. Thus, the switching electric field must be applied to the wafer at the working temperature $T_w$ which is substantially lower than the temperature $T_x$ and for the time interval $\tau_{dur}$ which is shorter than the dielectric response time $\tau_{res}$ and at least not shorter than the switching time $\tau_{sw}$. However, the working temperature $T_w$ must necessarily be higher than $T_{min}$ defined above.

Experiments show that, to avoid back switching at the sections 2 of the wafer associated with the first, unprotected regions of the wafer and to ensure that absolutely no changes occur in the polarity of the sections 3 associated with the second, protected regions, it is preferable that the working temperature $T_w$ is lower than the temperature at which the switching time $\tau_{sw}$ equals $\tau_{res}/10$ and the time interval $\tau_{dur}$ meets the following condition:

$$(1 \div 3)\tau_{sw} \leq \tau_{dur} \leq (0.1 \div 0.3)\tau_{res}$$

The following are three examples of the use of the above described method.

EXAMPLE 1

Figure 7:
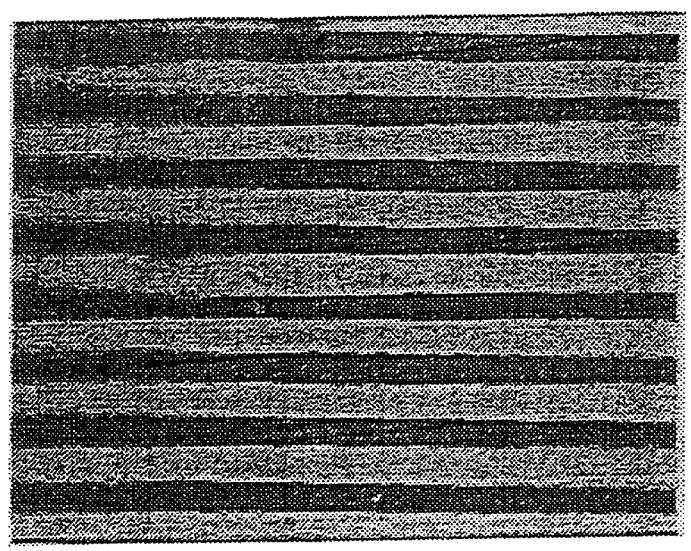
FIG. 7 is an optical microphotographic representation of a cross-section of a periodically invertedly poled domain structure made of a flux grown KTP crystal by means of the method of the present invention.

A periodically poled domain structure of a monodomain flux grown, z-cut KTP wafer was fabricated as follows. The wafer was patterned to have first and second spatial regions by the formation of the z⁺ polar surface of the wafer of a photoresist patterned layer having a period of modulation=$\Lambda=18$ μm. Both polar surfaces of the wafer were coated with the electrode layers of Ti having the thickness of about 1000 Å. The wafer was disposed in a vacuum chamber and its temperature was chosen to be $T_w$–57° C. At this temperature, the conductivity of the crystal is $\sigma=2.09\cdot10^{-12}$ $\Omega^{-1}$ cm$^{-1}$ and its dielectric response time $\tau_{res}$ is 1.27 s. At the applied switching electric field of 65 kV/cm, the switching time $\tau_{sw}$ is 2.37 ms. The time interval during which the switching electric field was applied to the wafer was chosen to be 5.5 ms. The periodically invertedly poled domain structures fabricated as above had a high quality grating of inverted domains across the entire wafer from the front to the back surface thereof (see FIG. 7) and presented the efficiency of the second harmonic generation close to the theoretical one.

EXAMPLE 2

Figure 8:
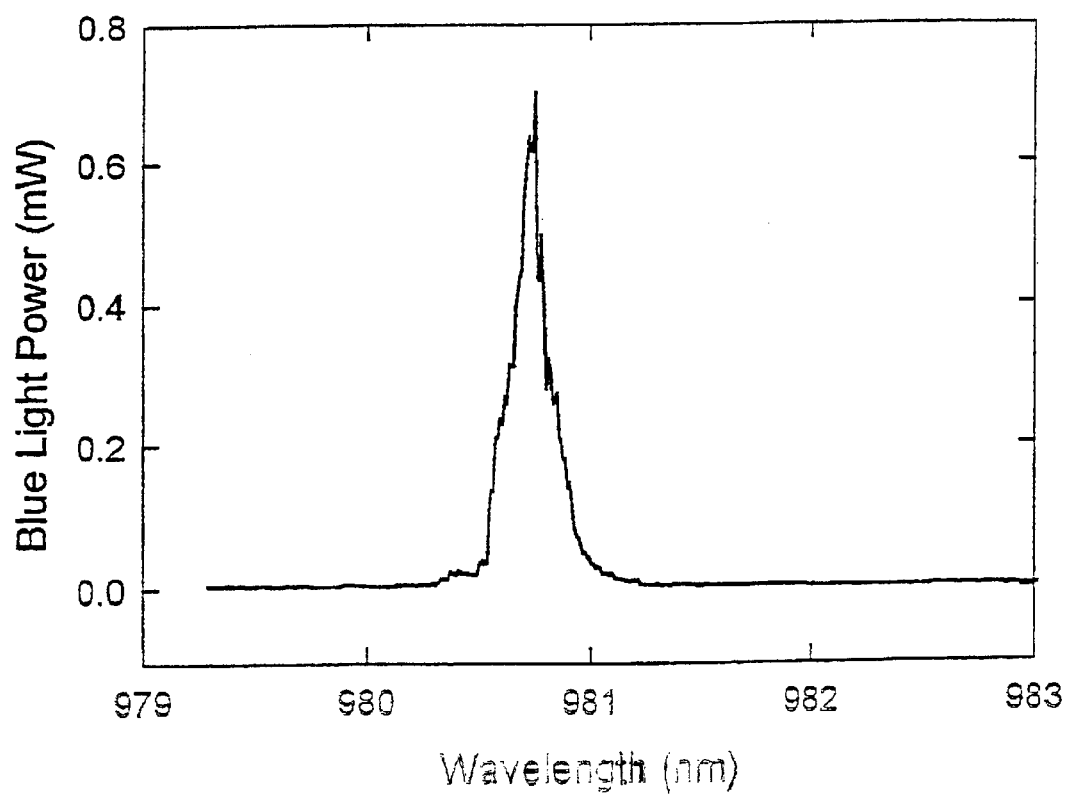
FIG. 8 illustrates the dependence of the intensity of the generated second harmonic intensity obtained with a periodically poled domain structure fabricated by means of the method of the present invention, on the wavelength of the fundamental radiation.

A periodically poled domain structure was fabricated similarly to the structure in Example 1 but had a thickness −0.5 mm, a length −9 mm and a period 6.9 μm. FIG. 8 illustrates the intensity of a second harmonic generation radiation obtained by means of this structure as a function of the wavelength of a fundamental IR radiation. The narrow width of the peak seen at 980.5 nm and its intensity indicate that the domain polarity inversion occurred along the entire length of the wafer. As seen, the method according to the present invention may be potentially used for fabricating PPDSs having very small periods such as those required for the generation of UV radiation, which can hardly be obtained with conventional techniques.

As mentioned above, the method of the present invention is useful not only for use with the ferroelectric crystals as indicated above but also with the ferroelectric crystals which, at room temperature, have a relatively long dielectric time response $\tau_{res}$ but coercive fields of which are very high. The use of such materials in the method of the present invention is associated with working temperatures higher than room temperature but substantially lower than the Curie temperature.

EXAMPLE 3

$LiNbO_3$ crystal at room temperature has very high coercive field, i.e. 260 kV/cm. By raising the temperature of the crystal, for example, to 130° C. or to 170° C., the coercive field may be reduced respectively to 80 kV/cm or to 60 kV/cm. Although at such temperatures the electrical conductivity of the crystal increases, its dielectric response time is still sufficiently long to meet the conditions of the present invention. There it is suggested, in accordance with the present invention, to pole a $LiNbO_3$ wafer at temperatures between 100° C. to 200° C. Thereby, relatively thick wafers may be used for the fabrication of invertedly poled domain structures of this kind of crystal.

Finally, invertedly poled domain structures fabricated by the method of the present invention may be periodic and non-periodic and may be used for different purposes associated with conversion of electromagnetic radiation. Periodically invertedly poled domain structures fabricated by the method of the present invention are particularly useful for providing quasi-phase matching between at least two radiation beams propagating within the structure, which may be used in second harmonic generators, sum frequency generators, difference frequency generators, optical parametric oscillators and the like. The structures may also be used for the purposes of optical switching, scanning and modulating.

What is claimed is:

1. A method of fabricating an invertedly poled domain structure having alternating sections of opposite electric polarities, from a ferroelectric crystal wafer having two opposite polar surfaces, the method comprising:

(a) patterning at least one of said two polar surfaces of the wafer to comprise a plurality of alternating discrete regions, of which first regions are adapted for, and second regions are protected from, the direct application thereto of an electric contact;

(b) applying to both polar surfaces of the wafer electrically conducting electrodes so that the first regions are in direct contact with the electrodes and the second regions are protected from such a contact;

(c) applying to the electrodes a switching electrical field of the intensity E which satisfies the condition $E_{br} > E \geq E_c$, $E_c$ being the coercive field of the ferroelectric crystal and $E_{br}$ being the breakdown field of the ferroelectric crystal; wherein said switching electrical field is applied to the wafer at a working temperature $T_w$ which satisfies the condition $T_{min} < T_w < T_x$, where the temperature $T_{min}$ is the minimal temperature at which the intensity E of the switching electric field still satisfies the condition $E_{br} > E \geq E_c$ and where $T_x$ is the temperature at which a dielectric response time $\tau_{res}$ equals a switching time $\tau_{sw}$ of the ferroelectric crystal at the chosen intensity E of the electric field; and wherein a time interval $\tau_{dur}$ during which the switching electric field is applied to the ferroelectric crystal wafer, meets the condition $$(1:3)\tau_{sw} \leq \tau_{dur} \leq (0.1:3)\tau_{res}.$$

2. A method according to claim 1, wherein the operation (c) is performed with the wafer being mounted on a temperature controlled stage.

3. A method according to claim 1, wherein the working temperature $T_w$ is lower than room temperature for ferroelectric crystal wafers whose dielectric response time $\tau_{res}$ at room temperature is shorter than their switching time $\tau_{sw}$ at the chosen intensity E of the switching electric field.

4. A method according to claim 1, wherein the working temperature $T_w$ is higher than room temperature and substantially lower than Curie temperature of the wafer for ferroelectric crystal wafers whose coercive field, $E_c$, at temperatures above room temperature is lower than at room temperature.

5. A method according to claim 1, wherein, before the step (a), the crystal of which the wafer is made is modified to change its conductivity so as to increase the dielectric response time $\tau_{res}$ to meet the condition $\tau_{res} > \tau_{sw}$.

6. A method according to claim 1, wherein the switching electric field applied to the wafer is in the form of a sequence of pulses the total duration of which is defined by $\tau_{dur}$.

7. A method according to claim 1, wherein the patterning of the wafer polar surface is provided by forming thereon a patterned layer of an isolating material.

8. A method according to claim 1, wherein the patterning of the wafer polar surface is provided by creating, adjacent the polar surface, a structure of chemically modified regions.

9. A method according to claim 1, wherein the patterning of the wafer polar surface is provided by creating, adjacent the polar surface, a structure of shallow inverted domains.

10. A method according to claim 1, wherein the ferroelectric material is $K_{1-x}Rb_xTiOP_{1-y}As_yO_4$ ($1 \geq x \geq 0$, $1 \geq y \geq 0$).

11. A method according to claim 1, wherein the ferroelectric material is $A_{1-x}B_xTi_{1-z}Nb_zOP_{1-y}As_yO_4$ ($1 \geq x \geq 0$, $1 \geq y \geq 0$, $1 \geq z \geq 0$), where A and B are one of the elements: Na, K, Cs, Rb or H.

12. A method according to claim 1, wherein the ferroelectric material is $LiNb_{1-x}Ta_xO_3$ ($1 \geq x \geq 0$).

13. A method according to claim 1, wherein the ferroelectric material is $KNb_{1-x}Ta_xO_3$ ($1 \geq x \geq 0$).

14. A method according to claim 1, wherein the invertedly poled domain structure is periodic.

15. A method according to claim 14, wherein the invertedly poled domain structure is adapted for use for the conversion of electromagnetic radiation.

16. A method according to claim 15, wherein the invertedly poled domain structure is adapted for the provision of quasi-phase matching between at least two radiation beams propagating within the structure.

17. A method according to claim 16, wherein the invertedly poled domain structure is adapted for use in second harmonic generators or sum frequency generators or difference frequency generators or optical parametric oscillators.

18. A method of fabricating an invertedly poled domain structure having alternating sections of opposite electric polarities, from a ferroelectric crystal wafer having two opposite polar surfaces, the method comprising:
   (a) patterning at least one of said two polar surfaces of the wafer to comprise a plurality of alternating discrete regions, of which first regions are adapted for, and second regions are protected from, the direct application thereto of an electric contact;
   (b) applying to both polar surfaces of the wafer electrically conducting electrodes so that the first regions are in direct contact with the electrodes and the second regions are protected from such a contact;
   (c) applying to the electrodes a switching electrical field of the intensity E which satisfies the condition $E_{br} > E \geq E_c$, $E_c$ being the coercive field of the ferroelectric crystal and $E_{br}$ being the breakdown field of the ferroelectric crystal; wherein
      a time interval $\tau_{dur}$, during which the switching electric field is applied to the ferroelectric crystal wafer, meets the condition $$(1:3)\tau_{sw} \leq \tau_{dur} \leq (0.1:0.3)\tau_{res}$$

where $\tau_{sw}$ and $\tau_{res}$ are, respectively, a switching time at the intensity E of the switching electric field and a dielectric response time of the ferroelectric crystal wafer.

19. A method according to claim 18, wherein the operation (c) is performed with the wafer being mounted on a temperature controlled stage in a vacuum chamber.

20. A method according to claim 18, wherein the electric voltage applied to the wafer is in the form of a sequence of pulses the total duration of which is defined by $\tau_{dur}$.

21. A method according to claim 18, wherein the patterning of the wafer polar surface is provided by forming thereon a patterned layer of an isolating material.

22. A method according to claim 18, wherein the patterning of the wafer polar surface is provided by creating, adjacent the polar surface, a structure of chemically modified regions.

23. A method according to claim 18, wherein the patterning of the wafer polar surface is provided by creating, adjacent the polar surface, a structure of shallow inverted domains.

24. A method according to claim 18, wherein the ferroelectric material is $K_{1-x}Rb_xTiOP_{1-y}As_yO_4$ ($1 \geq x \geq 0$, $1 \geq y \geq 0$).

25. A method according to claim 18, wherein the ferroelectric material is $A_{1-x}B_xTi_{1-z}Nb_zOP_{1-y}As_yO_4$ ($1 \geq x \geq 0$, $1 \geq y \geq 0$, $1 \geq z \geq 0$), where A and B are one of the elements: Na, K, Cs, Rb or H.

26. A method according to claim 18, wherein the ferroelectric material is $LiNb_{1-x}Ta_xO_3$ ($1 \geq x \geq 0$).

27. A method according to claim 18, wherein the ferroelectric material is $KNb_{1-x}Ta_xO_3$ ($1 \geq x \geq 0$).

28. A method according to claim 18, wherein the invertedly poled domain structure is periodic.

29. A method according to claim 28, wherein the invertedly poled domain structure is adapted for use for the conversion of electromagnetic radiation.

30. A method according to claim 29, wherein the invertedly poled domain structure is adapted for the provision of quasi-phase matching between at least two radiation beams propagating within the structure.

31. A method according to claim 30, wherein the invertedly poled domain structure is adapted for use in second harmonic generators or sum frequency generators or difference frequency generators or optical parametric oscillators.

32. A method of determining parameters for fabricating an invertedly poled domain structure having alternating sections of opposite electric polarities, from a ferroelectric crystal wafer having two opposite polar surfaces, the wafer being patterned at least at one of said two polar surfaces of said wafer to comprise a plurality of alternating discrete regions, of which first regions are adapted for, and second regions are protected from, the direct application thereto of an electric contact, to enable the applications to both of its polar surfaces of electrically conducting electrodes so that the first regions are in direct contact with the electrodes and the second regions are protected from such a contact; the method comprising:
   (a) choosing an intensity E of an electric field for applying to said electrodes, which satisfies the condition $E_{br} > E \geq E_c$, $E_c$ being the coercive field of said ferroelectric crystal and $E_{br}$ being the breakdown field of said ferroelectric crystal wafer;
   (b) determining the dependency of a switching time $\tau_{sw}$ of said ferroelectric crystal wafer on temperature at the chosen intensity E of the electric field;
   (c) determining a temperature $T_x$ at which said switching time $\tau_{sw}$ of the ferroelectric crystal wafer at the chosen intensity E of the electric field equals a dielectric response time $\tau_{res}$ of the ferroelectric crystal wafer; and
   (d) determining a working temperature $T_w$ at which said switching electric field applied to the wafer satisfies the condition $T_{min} < T_w < T_x$, where the temperature $T_{min}$ is the minimum temperature at which the intensity E of the switching electric field still satisfies the condition $E_{br} > E > E_c$.

33. A method according to claim 32, further including a time determining interval, $\tau_{dur}$, during which the switching electric field is applied to the ferroelectric crystal wafer, to meet the condition $$\tau_{sw} < \tau_{dur} < \tau_{res}.$$

34. A method according to claim 33, wherein the time interval $\tau_{dur}$ meets the condition $$(1:3)\tau_{sw} \leq \tau_{dur} \leq (0.1:0.3)\tau_{res}.$$

35. A method according to claim 32, wherein the working temperature $T_w$ is lower than room temperature for ferroelectric crystal whose dielectric response time $\tau_{res}$ at room temperature is shorter than their switching time $\tau_{sw}$ at the chosen intensity E of the switching electric field.

36. A method according to claim 32, wherein the working temperature $T_w$ is higher than room temperature and substantially lower than Curie temperature of the wafer for ferroelectric crystal wafers whose coercive field, $E_c$, at temperatures above room temperature is lower than at room temperature.

37. A method according to claim 32, wherein the ferroelectric crystal material is selected from $LiNb_{1-x}Ta_xO_3$, $KNb_{1-x}Ta_xO_3$, $K_{1-x}Rb_xTiOP_{1-y}As_yO_4$, or $A_{1-x}B_xTi_{1-z}Nb_zOP_{1-y}As_yO_4$, where A and B are one of the elements: Na, K, Cs, Rb or H, and where x, y, and z are each independently a fraction between 0 and 1, inclusive.

38. A method of fabricating an invertedly poled domain structure having alternating sections of opposite electric polarities, from a ferroelectric crystal wafer having two opposite polar surfaces, the method comprising:
   (a) providing said wafer made of a ferroelectric material whose dielectric response time $\tau_{res}$ is shorter than the switching time $\tau_{sw}$ at room temperature, and is equal to said switching time at a temperature $T_x$ lower than room temperature, at an intensity E of a switching electrical field which satisfies the condition $E_{br}>E>E_c$, $E_c$ being the coercive field of the ferroelectric crystal and $E_{br}$ being the breakdown field of the ferroelectric crystal;

(b) patterning at least one of said two polar surfaces of said wafer to comprise a plurality of alternating discrete regions, of which first regions are adapted for, and second regions are protected from, the direct application thereto of an electric contact;

(c) applying to both polar surfaces of the wafer electrically conducting electrodes so that the first regions are in direct contact with the electrodes and the second regions are protected from such a contact;

(d) applying to the electrodes a switching electrical field of said intensity E wherein
said switching electrical field is applied to the wafer at a working temperature $T_w$ which satisfies the condition $T_{min}<T_w<T_x$, where the temperature $T_{min}$ is the minimal temperature at which the intensity E of the switching electric field still satisfies the condition $E_{br}>E\geq E_c$.

39. A method according to claim 38, wherein, before the step (b), the crystal of which the wafer is made, is modified to change its conductivity so as to increase the dielectric response time $\tau_{res}$ to meet the condition $\tau_{res}>\tau_{sw}$ in step (a).

40. A method according to claim 38, wherein the ferroelectric material is $K_{1-x}Rb_xTiOP_{1-y}As_yO_4$ ($1\geq x\geq 0$, $1\geq y\geq 0$).

41. A method according to claim 38, wherein the ferroelectric material is $A_{1-x}B_xTi_{1-z}Nb_zOP_{1-y}As_yO_4$ ($1\geq x\geq 0$, $1\geq y\geq 0$, $1\geq z\geq 0$), where A and B are one of the elements: Na, K, Cs, Rb or H.

42. A method according to claim 38, wherein the ferroelectric material is $KNb_{1-x}Ta_xO_3$ ($1\geq x\geq 0$).

43. A method according to claim 38, further including a time determining interval, $\tau_{dur}$, during which the switching electric field is applied to the ferroelectric crystal wafer, to meet the condition $$\tau_{sw}<\tau_{dur}<\tau_{res}.$$

44. A method according to claim 43, wherein the time interval $\tau_{dur}$ meets the condition $$(1:3)\tau_{sw}\leq\tau_{dur}\leq(0.1:0.3)\tau_{res}.$$

45. A method of fabricating an invertedly poled domain structure having alternating sections of opposite electric polarities, from a ferroelectric crystal wafer having two opposite polar surfaces, the method comprising:

(a) providing said wafer made of a ferroelectric crystal having at room temperature a dielectric response time $\tau_{res}$ shorter than its switching time $\tau_{sw}$;

(b) modifying said crystal to change its conductivity so as to increase the dielectric response time $\tau_{res}$ to meet the condition $\tau_{res}>\tau_{sw}$;

(c) patterning at least one of said two polar surfaces of the wafer to comprise a plurality of alternating discrete regions, of which first regions are adapted for, and second regions are protected from, the direct application thereto of an electric contact;

(d) applying to both polar surfaces of the wafer electrically conducting electrodes so that the first regions are in direct contact with the electrodes and the second regions are protected from such a contact;

(e) applying to the electrodes a switching electrical field of the intensity E which satisfies the condition $E_{br}\geq E\geq E_c$, $E_c$ being the coercive field of the ferroelectric crystal and $E_{br}$ being the breakdown field of the ferroelectric crystal; wherein
said switching electrical field is applied to the wafer at a working temperature $T_w$ which satisfies the condition $T_{min}<T_w<T_x$, where the temperature $T_{min}$ is the minimal temperature at which the intensity E of the switching electric field still satisfies the condition $E_{br}>E\geq E_c$ and where $T_x$ is the temperature at which said dielectric response time $\tau_{res}$ equals said switching time $\tau_{sw}$ of the ferroelectric crystal at the chosen intensity E of the electric field.

46. A method according to claim 45, further including a time determining interval, $\tau_{dur}$, during which the switching electric field is applied to the ferroelectric crystal wafer, to meet the condition $$\tau_{sw}<\tau_{dur}<\tau_{res}.$$

47. A method according to claim 46, wherein the time interval $\tau_{dur}$ meets the condition:

$$(1:3)\tau_{sw}\leq\tau_{dur}\leq(0.1:0.3)\tau_{res}.$$

* * * * *

UNITED STATES PATENT AND TRADEMARK OFFICE
CERTIFICATE OF CORRECTION

PATENT NO. : 6,597,492 B1
DATED : July 22, 2003
INVENTOR(S) : Gil Rosenman et al.

It is certified that error appears in the above-identified patent and that said Letters Patent is hereby corrected as shown below:

Column 6,
Line 3, delete "(1/3) $\tau_{sw} \leq \tau_{dur} \leq$ (0.1/0.3) $\tau_{res}$", and insert therefor -- (1÷3) $\tau_{sw} \leq \tau_{dur} \leq$ (0.1÷0.3) $\tau_{res}$ --
Line 19, delete "$1 \geq x \leq 0$" and insert therefor -- $1 \geq x \geq 0$ --
Line 19, delete "$1 \geq x 0$" and insert therefore -- $1 \geq x \geq 0$ --

Column 7,
Line 55, delete "$KTiPO_4$" and insert therefor -- $KTiOPO_4$ --

Column 9,
Line 1, delete "-0.5 mm, a length -9" and insert therefor -- 0.5 mm, a length - 9 --

Column 10,
Line 13, delete "(1:3) $\tau_{sw} \leq \tau_{dur} \leq$ (0.1:0.3) $\tau_{res}$", and insert therefor -- (1÷3) $\tau_{sw} \leq \tau_{dur} \leq$ (0.1÷0.3) $\tau_{res}$ --

Column 11,
Line 22, delete "(1:3) $\tau_{sw} \leq \tau_{dur} \leq$ (0.1:0.3) $\tau_{res}$", and insert therefor -- (1÷3) $\tau_{sw} \leq \tau_{dur} \leq$ (0.1÷0.3) $\tau_{res}$ --

Column 12,
Line 43, delete "(1:3) $\tau_{sw} \leq \tau_{dur} \leq$ (0.1:0.3) $\tau_{res}$", and insert therefor -- (1÷3) $\tau_{sw} \leq \tau_{dur} \leq$ (0.1÷0.3) $\tau_{res}$ --

Column 13,
Line 3, delete "$E_{br} > E > E_c$" and insert therefor -- $E_{br} > E \geq E_c$ --
Line 46, delete "(1:3) $\tau_{sw} \leq \tau_{dur} \leq$ (0.1:0.3) $\tau_{res}$", and insert therefor -- (1÷3) $\tau_{sw} \leq \tau_{dur} \leq$ (0.1÷0.3) $\tau_{res}$ --

UNITED STATES PATENT AND TRADEMARK OFFICE
CERTIFICATE OF CORRECTION

PATENT NO.   : 6,597,492 B1
DATED        : July 22, 2003
INVENTOR(S)  : Gil Rosenman et al.

It is certified that error appears in the above-identified patent and that said Letters Patent is hereby corrected as shown below:

Column 14,
Line 45, delete "(1:3) $\tau_{sw} \leq \tau_{dur} \leq$ (0.1:0.3) $\tau_{res}$", and insert therefor -- (1÷3) $\tau_{sw} \leq \tau_{dur} \leq$ (0.1÷0.3) $\tau_{res}$ --

Signed and Sealed this

Twelfth Day of October, 2004

JON W. DUDAS
*Director of the United States Patent and Trademark Office*